(12) United States Patent
Kim et al.

(10) Patent No.: US 9,952,740 B1
(45) Date of Patent: Apr. 24, 2018

(54) COLOR CONVERSION PANEL, DISPLAY DEVICE INCLUDING THE SAME, AND METHOD OF MANUFACTURING COLOR CONVERSION PANEL

(71) Applicant: Samsung Display Co., Ltd., Yongin-si (KR)

(72) Inventors: Soo Dong Kim, Seoul (KR); Su Jin Kim, Seoul (KR); Jin Won Kim, Suwon-si (KR); Hyeok Jin Lee, Seongnam-si (KR); Jae Bum Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/632,851

(22) Filed: Jun. 26, 2017

(30) Foreign Application Priority Data

Oct. 26, 2016 (KR) .......................... 10-2016-0140254

(51) Int. Cl.
| | |
|---|---|
| *G02B 5/20* | (2006.01) |
| *G06F 3/0481* | (2013.01) |
| *G06T 11/00* | (2006.01) |
| *G06F 3/0484* | (2013.01) |
| *G03G 15/01* | (2006.01) |
| *C09K 11/08* | (2006.01) |
| *G02B 5/22* | (2006.01) |
| *G03F 7/00* | (2006.01) |
| *G02F 1/1335* | (2006.01) |

(52) U.S. Cl.
CPC ............ *G06F 3/0481* (2013.01); *C09K 11/08* (2013.01); *G02B 5/20* (2013.01); *G02B 5/201* (2013.01); *G02B 5/206* (2013.01); *G02B 5/223* (2013.01); *G03F 7/0007* (2013.01); *G03G 15/01* (2013.01); *G06F 3/04845* (2013.01); *G06T 11/001* (2013.01); *G02F 1/133514* (2013.01); *G02F 1/133516* (2013.01); *G02F 1/133617* (2013.01)

(58) Field of Classification Search
CPC ............ G03F 7/0007; G02F 1/133514; G02F 1/133516; G02F 1/133617; G02B 5/20; G02B 5/201; G02B 5/206; G02B 5/223
USPC .............................................. 430/7; 349/106
See application file for complete search history.

(56) References Cited

U.S. PATENT DOCUMENTS

2012/0019740 A1* 1/2012 Kadowaki .............. G02B 5/201
                                                        349/61
2013/0242228 A1* 9/2013 Park .................. G02F 1/133617
                                                        349/61

(Continued)

FOREIGN PATENT DOCUMENTS

| KR | 10-2009-0117094 | 11/2009 |
| KR | 10-2015-0070851 | 6/2015 |
| KR | 10-2016-0015480 | 2/2016 |

*Primary Examiner* — John A McPherson
(74) *Attorney, Agent, or Firm* — H.C. Park & Associates, PLC

(57) ABSTRACT

A color conversion panel includes a substrate, a color conversion layer, a transmission layer, and a blue light cutting filter. The color conversion layer is disposed on the substrate. The color conversion layer includes a quantum dot. The transmission layer is disposed on the substrate. The blue light cutting filter is disposed between the substrate and the color conversion layer. An interface between the color conversion layer and the blue light cutting filter includes irregularities.

20 Claims, 16 Drawing Sheets

(56) References Cited

U.S. PATENT DOCUMENTS

2015/0301408 A1* 10/2015 Li .................... G02F 1/133621
362/84
2016/0033823 A1   2/2016 Lee et al.
2016/0190523 A1   6/2016 Kim et al.
2016/0197308 A1   7/2016 Jeong

* cited by examiner

COLOR CONVERSION PANEL, DISPLAY DEVICE INCLUDING THE SAME, AND METHOD OF MANUFACTURING COLOR CONVERSION PANEL

CROSS-REFERENCE TO RELATED APPLICATION

This application claims priority from and the benefit of Korean Patent Application No. 10-2016-0140254, filed Oct. 26, 2016, which is hereby incorporated by reference for all purposes as if fully set forth herein.

BACKGROUND

Field

Exemplary embodiments relate to a color conversion panel, a display device including the same, and a method of manufacturing a color conversion panel.

Discussion

A liquid crystal display typically includes two electrodes forming an electric field, a liquid crystal layer, a color filter, a polarizer, and the like. Light loss may occur in association with the polarizer and the color filter. Accordingly, to realize a display device with reduced light loss and having higher efficiency, a display device including a color conversion panel may be utilized. In addition, a display device including a light-emitting element can emit light of red, green, blue, and/or the like colors depending on a wavelength of emitted light. In the case of a display device including a color conversion panel, the size and content of quantum dots can be controlled to provide even better color reproducibility and luminance.

The above information disclosed in this section is only for enhancement of an understanding of the background of the inventive concepts, and, therefore, it may contain information that does not form prior art already known to a person of ordinary skill in the art.

SUMMARY

Exemplary embodiments provide a color conversion panel, a display device including a color conversion panel, and method of manufacturing a color conversion panel. The color conversion panel is capable of improving a light emission ratio and increasing reliability.

Additional aspects will be set forth in the detailed description which follows, and, in part, will be apparent from the disclosure, or may be learned by practice of the inventive concepts.

According to some exemplary embodiments, a color conversion panel includes a substrate, a color conversion layer, a transmission layer, and a blue light cutting filter. The color conversion layer is disposed on the substrate. The color conversion layer includes a quantum dot. The transmission layer is disposed on the substrate. The blue light cutting filter is disposed between the substrate and the color conversion layer. An interface between the color conversion layer and the blue light cutting filter includes irregularities.

According to some exemplary embodiments, a method of manufacturing a color conversion panel includes: forming a photosensitive resin layer on a substrate, exposing the photosensitive resin layer, performing a surface treatment on the exposed photosensitive resin layer to form irregularities, patterning the exposed photosensitive resin layer to form a blue light cutting filter, forming a color conversion layer on the blue light cutting filter, forming a transmission layer on the substrate.

According to some exemplary embodiments, a display device includes a display panel and a color conversion panel overlapping the display panel. The color conversion panel includes a substrate, a color conversion layer, a transmission layer, and a blue light cutting filter. The color conversion layer is disposed between the substrate and the display panel. The transmission layer is disposed between the substrate and the display panel. The blue light cutting filter is disposed between the substrate and the color conversion layer. An interface between the color conversion layer and the blue light cutting filter includes irregularities.

According to some exemplary embodiments, it is possible to provide a color conversion panel and a display device including the same having improved light emission efficiency and increasing reliability.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1A:
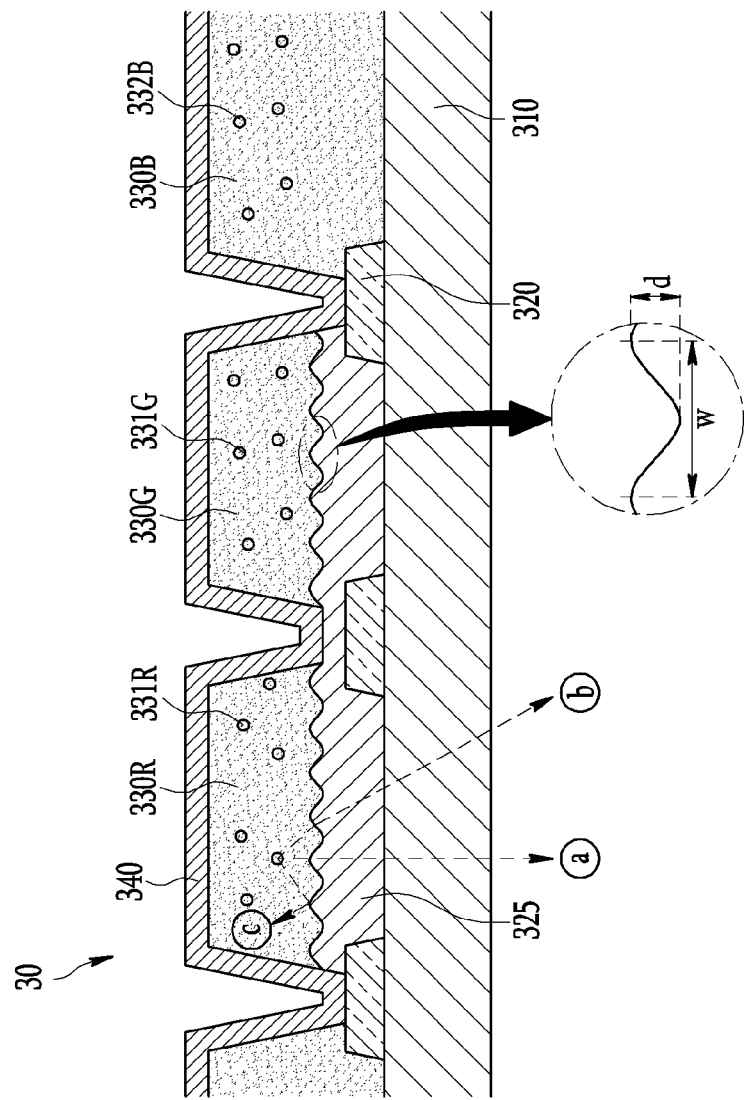
FIGS. 1A, 1B, and 1C are cross-sectional views illustrating color conversion panels according to various exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. Further, for the purposes of this disclosure, the phrase "in a plan view" means when an object portion is viewed from above, and the phrase "in a cross-section" means when a cross-section taken by vertically cutting an object portion is viewed from the side.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1A is a cross-sectional view illustrating a color conversion panel according to some exemplary embodiments.

As seen in FIG. 1A, the color conversion panel 30 includes a light blocking member (or pattern) 320 disposed on a substrate 310. The light blocking member 320 may be disposed between a red color conversion layer 330R and a green color conversion layer 330G, between the green color conversion layer 330G and a transmission layer 330B, and between the transmission layer 330B and the red color conversion layer 330R or between same layers of the red color conversion layer 330R, the green color conversion layer 330G, and/or the transmission layer 330B. The light blocking member 320 may define regions where the red color conversion layer 330R, the green color conversion layer 330G, and the transmission layer 330B are disposed and, thereby, exposed for light transmission.

A blue light cutting filter 325 may be disposed on at least portions of the substrate 310 and the light blocking member 320. The blue light cutting filter 325 may be disposed only in regions that emit red light and green light, and, thereby, may not be disposed in a region that emits blue light. The blue light cutting filter 325 may have an opening that overlaps the region that emits blue light.

The blue light cutting filter 325 may transmit light having a wavelength (or a range of wavelengths) except for light in a blue wavelength band, and blocks light having a wavelength in the blue wavelength band. The blue light cutting filter 325 may include any material for performing the aforementioned effect, and may be, for example, a yellow color filter. A cross-section of the blue light cutting filter 325 may have a tapered shape. As such, elements stacked on the blue light cutting filter 325 may be stably formed without a break.

One surface (e.g., an upper surface) of the blue light cutting filter 325 may have irregularities. For instance, the blue light cutting filter 325 may have a first surface that faces the substrate 310, and a second surface that faces the first surface, contacts the red color conversion layer 330R and the green color conversion layer 330G, and includes irregularities. Roughness of the second surface of the blue light cutting filter 325 may be increased.

The irregularities may have an irregular shape. As shown in FIG. 1A, the irregularities include a recess portion and a convex portion. In this case, a ratio of a distance w between adjacent convex portions (or a distance between adjacent concave portions) and a depth d between an inflection point of the convex portion and an apex of the concave portion which are adjacent to each other may be about 1:1 to about 10:1. The depth d may be in a range of about 0.1 μm to about 2 μm, and the distance w may be in a range of about 0.01 μm to 2 μm. Within this numerical range, effective light emission is possible.

Light emitted from the color conversion panel 30 is emitted in a direction from the red color conversion layer 330R and the green color conversion layer 330G toward the substrate 310. In this case, light from the red color conversion layer 330R and the green color conversion layer 330G emitted toward the blue light cutting filter 325 can be emitted in a larger amount toward the substrate 310 in one side surface including the irregularities. The light from the red color conversion layer 330R and the green color conversion layer 330G emitted toward the blue light cutting filter 325 will be described in more detail later. The red color conversion layer 330R, the green color conversion layer 330G, and the transmission layer 330B are disposed on at least one of the blue light cutting filter 325, the light blocking member 320, and the substrate 310.

Although described as a red color conversion layer 330R and a green color conversion layer 330G, it is noted that any suitable color conversion layer may be utilized in association with exemplary embodiments and may convert introduced light into light of different colors. For descriptive convenience, the color conversion layers 330R and 330G will be respectively described as a red color conversion layer 330R and a green color conversion layer 330G. The transmission layer 330B may emit introduced light without any color conversion. For instance, the transmission layer 330B may emit blue light.

The red color conversion layer 330R includes at least one of a phosphor and a quantum dot 331R that convert introduced blue light into red light. When the red color conversion layer 330R includes a red phosphor, the red phosphor may contain at least one of (Ca, Sr, Ba)S, (Ca, Sr, Ba)$_2$Si$_5$N$_8$, CaAlSiN$_3$, CaMoO$_4$, and Eu$_2$Si$_5$N$_8$, but exemplary embodiments are not limited thereto or thereby. The red color conversion layer 330R may include at least one kind of red phosphor.

The green color conversion layer 330G includes at least one of a phosphor and a quantum dot 331G for converting introduced blue light into green light. When the green color conversion layer 330G includes a green phosphor, the green phosphor may be at least one of yttrium aluminum garnet, (Ca, Sr, Ba)$_2$SiO$_4$, SrGa$_2$S$_4$, barium magnesium aluminate (BAM), α-SiAlON, β-SiAlON, Ca$_3$Sc$_2$Si$_3$O$_{12}$, Tb$_3$Al$_5$O$_{12}$, BaSiO$_4$, CaAlSiON, and (Sr$_{1-x}$Ba$_x$)Si$_2$O$_2$N$_2$, but exemplary embodiments are not limited thereto or thereby. The green color conversion layer 330G may include at least one kind of green phosphor. In this case, x may be any number between 0 and 1.

The red color conversion layer 330R and the green color conversion layer 330G may include a quantum dot instead of a phosphor, or may further include a quantum dot in addition to the phosphor. In this case, the quantum dot can be selected from a group II-VI compound, a group III-V compound, a group IV-VI compound, a group IV element, a group IV compound, and/or a combination thereof.

For the group II-VI compound, a binary compound selected from CdSe, CdTe, ZnS, ZnSe, ZnTe, ZnO, HgS, HgSe, HgTe, MgSe, MgS, and a mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, may be employed. For the group III-V compound, a binary compound selected from GaN, GaP, GaAs, GaSb, AN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; or a quaternary compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof, may be employed. For the group IV-VI compound, a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; or a quaternary compound selected from SnPbSSe, SnPbSeTe, SnPbSTe, and a mixture thereof, may be employed. For the IV group element, Si, Ge, or a mixture thereof may be selected. For the IV group compound, a binary compound selected from SiC, SiGe, and a mixture thereof may be employed.

In this case, the binary compound, the ternary compound, or the quaternary compound may exist in a uniform concentration or in a partially different concentration in particles. A quantum dot may include multiple quantum dots, and the quantum dots may have a core/shell structure in which one quantum dot surrounds another quantum dot. An interface between a core and a shell may have a concentration gradient such that a concentration of an element in the shell decreases toward a center thereof.

A quantum dot may have a full width at half maximum (FWHM) of the light-emitting wavelength spectrum that is greater than 0 and less than or equal to about 45 nm, such as greater than 0 and less than or equal to about 40 nm, for instance, greater than 0 and less than or equal to about 30 nm. In these ranges, color purity or color reproducibility may be improved. In addition, since light emitted through the quantum dot is emitted in all directions, a viewing angle of light may be improved.

The quantum dot is not specifically limited to any particular shape. For instance, a quantum dot may have a shape such as a nano-particle having a spherical shape, a pyramid shape, a multi-arm shape, or a cubic shape, or may be a nanotube, a nanowire, a nanofiber, a planar nano-particle, etc.

Light emitted from the red quantum dot 331R and the green quantum dot 331G can spread in all directions. Among the light, light emitted toward the substrate 310 is introduced to the eyes of an observer. According to an exemplary embodiment, light emitted by the quantum dot 331R included in the red color conversion layer 330R may be emitted to the outside of the substrate 310 directly through the blue light cutting filter 325 (illustrated as light path (a)), may be partially refracted through the irregularities at an interface between the blue light cutting filter 325 and the color conversion layer 330R to be emitted outside of the substrate 310 (illustrated as light path (b)), or may be totally reflected at an interface between the blue light cutting filter 325 and the red color conversion layer 330R (illustrated as light path (c)).

In an exemplary embodiment, interfaces between the red color conversion layer 330R, green color conversion layer 330G, and the blue light cutting filter 325 include irregularities. In this manner, the blue light cutting filter 325 may be disposed, in a direction normal to a surface of the substrate 310, between the light blocking member 320 and the capping layer 340. By the action of the irregularities, light emitted from the red color conversion layer 330R and the green color conversion layer 330G can be emitted to the outside of the substrate 310. Accordingly, it is possible to reduce total reflection of light emitted from the color conversion panel 30 and to increase external light emission efficiency of the light. Dissimilarly, when no irregular interface is positioned between the blue light cutting filter 325 and a color conversion layer (e.g., the red color conversion layer 330R), most light passing in a direction of the substrate 310 in the color conversion panel 30 is totally reflected at an interface between the color conversion layer and the blue light cutting filter 325. Accordingly, a small amount of light may be emitted to the outside of the substrate 310, thereby reducing light efficiency.

The transmission layer 330B may include a resin that transmits blue light incident thereto. The transmission layer 330B positioned in a region for emitting blue light emits introduced blue light at it is without a separate phosphor or quantum dot. It is contemplated, however, that the transmission layer 330B may further include a dye or pigment 332B, which may be omitted in an exemplary embodiment.

The red color conversion layer 330R, the green color conversion layer 330G, and the transmission layer 330B may include a photosensitive resin as an example, and may be manufactured by a photolithography process. Additionally (or alternatively), the red color conversion layer 330R, the green color conversion layer 330G, and the transmission layer 330B may be manufactured by a printing process, and when manufactured by the printing process, the red color conversion layer 330R, the green color conversion layer 330G, and the transmission layer 330B may include materials other than a photosensitive resin. For convenience, the red color conversion layer 330R, the green color conversion layer 330G, the transmission layer 330B, and the light blocking member 320 will be described as formed by the photolithography process or the printing process, but exemplary embodiments are not limited thereto or thereby.

At least one of the red color conversion layer 330R, the green color conversion layer 330G, and the transmission layer 330B may include a scatterer (not shown). For example, the red color conversion layer 330R, the green color conversion layer 330G, and the transmission layer 330B may respectively include the scatterer, but are not limited thereto or thereby. For instance, the transmission layer 330B may include the scatterer, while the red color conversion layer 330R and the green color conversion layer 330G may not include the scatterer. The scatterer may include any suitable material that can scatter (e.g., evenly scatter) incident light. For example, the scatter may include at least one of $TiO_2$, $ZrO_2$, $Al_2O_3$, $In_2O_3$, ZnO, $SnO_2$, $Sb_2O_3$, and ITO.

A capping layer 340 is disposed on the red color conversion layer 330R, the green color conversion layer 330G, the transmission layer 330B, and the light blocking member 320. The capping layer 340 serves to prevent (or reduce) damage and extinction of phosphors or quantum dots 331R and 331G included in the red color conversion layer 330R and the green color conversion layer 330G. The capping layer 340 also serves to reflect or absorb light other than light having a specific wavelength (or range of wavelengths) while transmitting light having the specific wavelength in relatively high temperature processes after the red color conversion layer 330R, the green color conversion layer 330G, and the transmission layer 330B are formed.

The capping layer 340 may have a structure in which an inorganic layer having a relatively high refractive index and an inorganic layer having a relatively low refractive index are alternately stacked to form about 10 to 20 layers. That is, the capping layer 340 may have a structure in which a plurality of layers having different refractive indices are stacked. In this case, the capping layer 340 may reflect or absorb light having a specific wavelength. To that end, the capping layer 340 utilizes a principle of transmitting and/or reflecting light having a specific wavelength using reinforcement and/or destructive interference between an inorganic layer having a relatively high refractive index and an inorganic layer having a relatively low refractive index.

The capping layer 340 may include at least one of $TiO_2$, $SiN_x$, $SiO_y$, TiN, AlN, $Al_2O_3$, $SnO_2$, $WO_3$, and $ZrO_2$. For example, the capping layer 340 may have a structure in which $SiN_x$ and $SiO_y$ are alternately stacked.

In the color conversion panel 30, an interface between the red color conversion layer 330R, the green color conversion layer 330G, and the blue light cutting filter 325 may have irregularities, and as such, total reflection at the interface may be reduced to increase an amount of light emitted to the outside of the substrate 310.

Figure 1B:
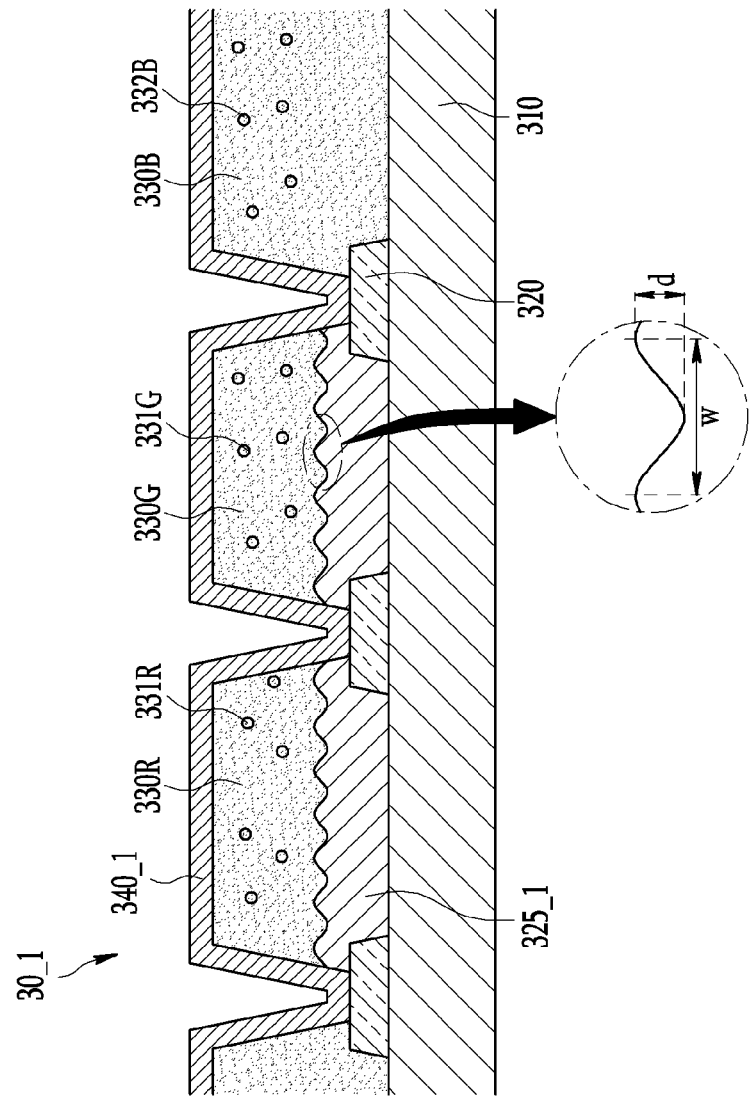
Figure 1C:
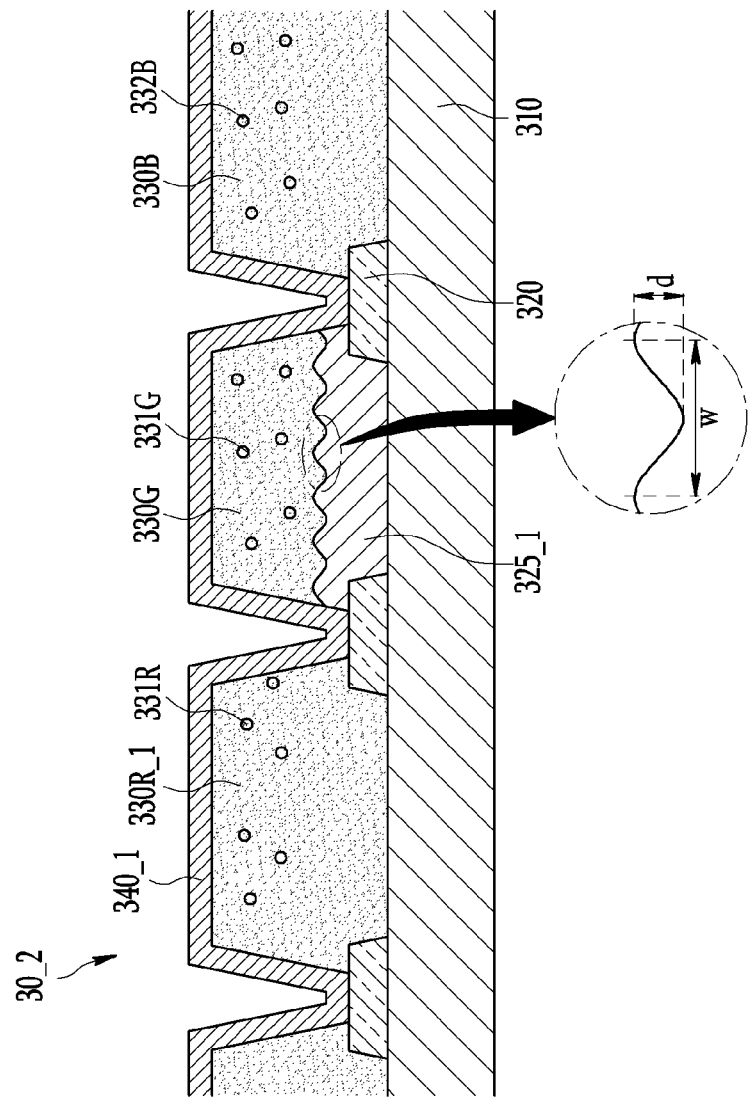

FIGS. 1B and 1C are cross-sectional views illustrating color conversion panels according to various exemplary embodiments. The color conversion panels of FIGS. 1B and 1C are similar to the color conversion panel 30 of FIG. 1. As such, primarily differences will be described to avoid obscuring exemplary embodiments.

Referring to FIG. 1B, color conversion panel 30_1 includes a blue light cutting filter 325_1 that may be separately disposed in each of a first region that emits red light and a second region that emits green light. As seen in FIG. 1A, the blue light cutting filter 325 is continuous in the first region that emits red light and the second region that emits green light, which overlap each other, but exemplary embodiments are not limited thereto or thereby. For example, as shown in FIG. 1B, blue light cutting filters 325_1 disposed in the first region that emits red light and the second region that emits green light may be separate from each other. In this manner, the capping layer 340_1 may be disposed between adjacent blue light cutting filters 325_1.

To this end, the capping layer 340_1 may be disposed on light blocking member 320, whereas capping layer 340 may be disposed on blue light cutting filter 325. The color conversion panel 30_1 may otherwise be the same as the color conversion panel 30 described in association with FIG. 1A.

Referring to FIG. 1C, color conversion panel 30_2 may include a blue light cutting filter 325_1 disposed in the second region that emits green light only, while no blue light cutting filter 325_1 is disposed in the first region that emits red light or the third region that emits blue light. Exemplary embodiments, however, are not limited thereto or thereby. For example, the blue light cutting filter 325_1 may be disposed in the first region that emits red light only, while no blue light cutting filter 325_1 may be disposed in the second region that emits green light and the third region that emits blue light. In this manner, a color conversion layer (e.g., the red color conversion layer 330R_1) may fill a larger amount of space between capping layer 340_1 and the substrate 310. The color conversion panel 30_2 may otherwise be the same as the color conversion panel 30_1 described in association with FIG. 1B.

Figure 2:
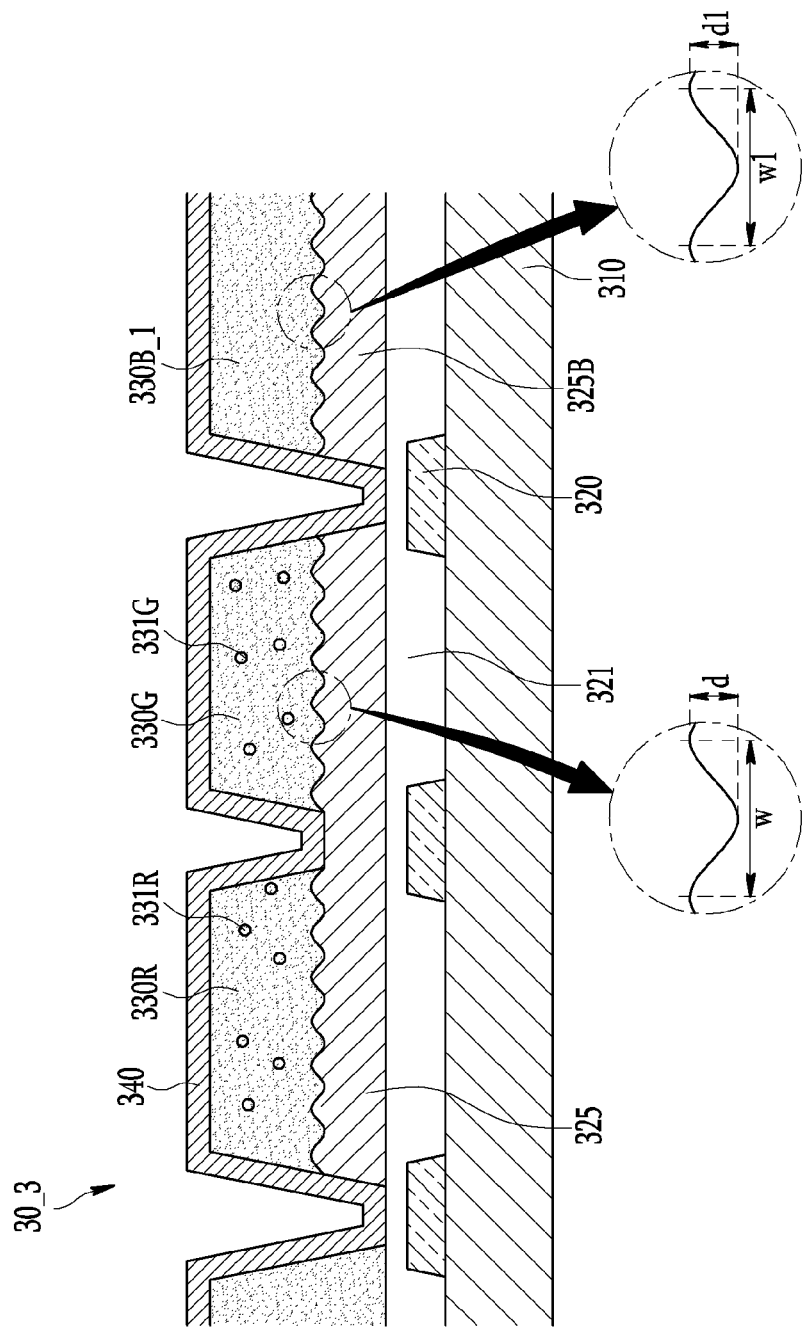
FIGS. 2, 3, and 4 are cross-sectional views illustrating color conversion panels according to various exemplary embodiments.
Figure 3:
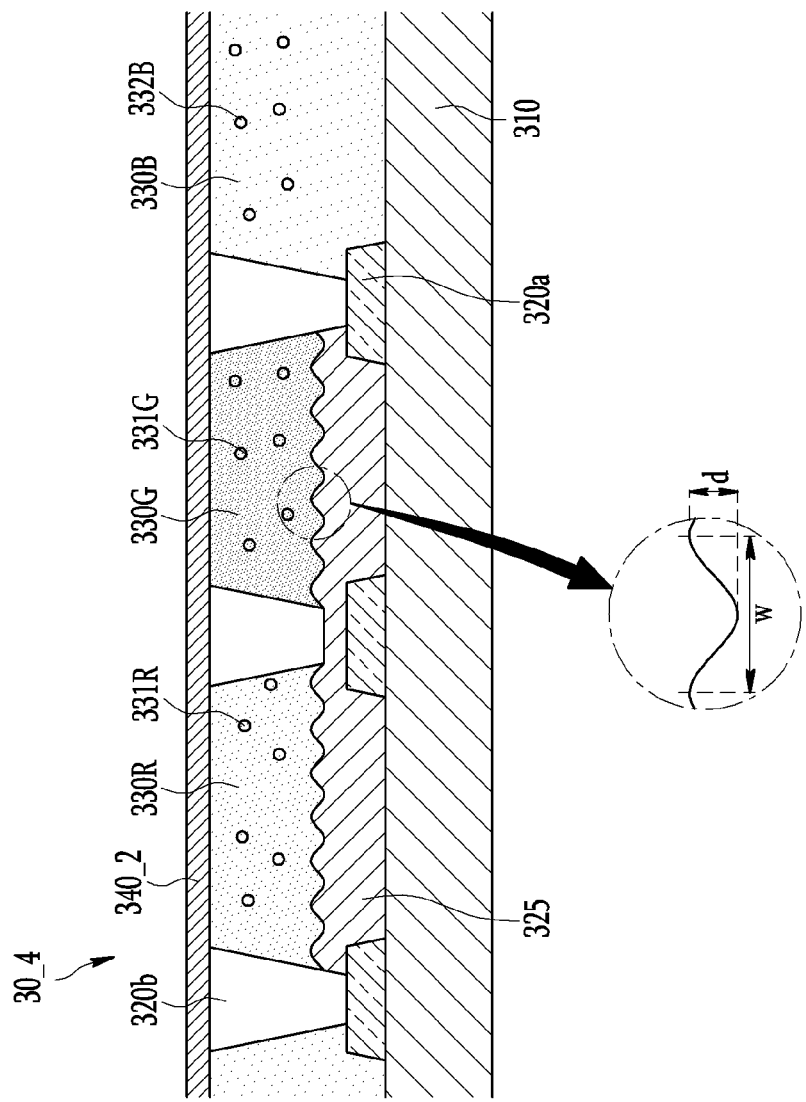
Figure 4:
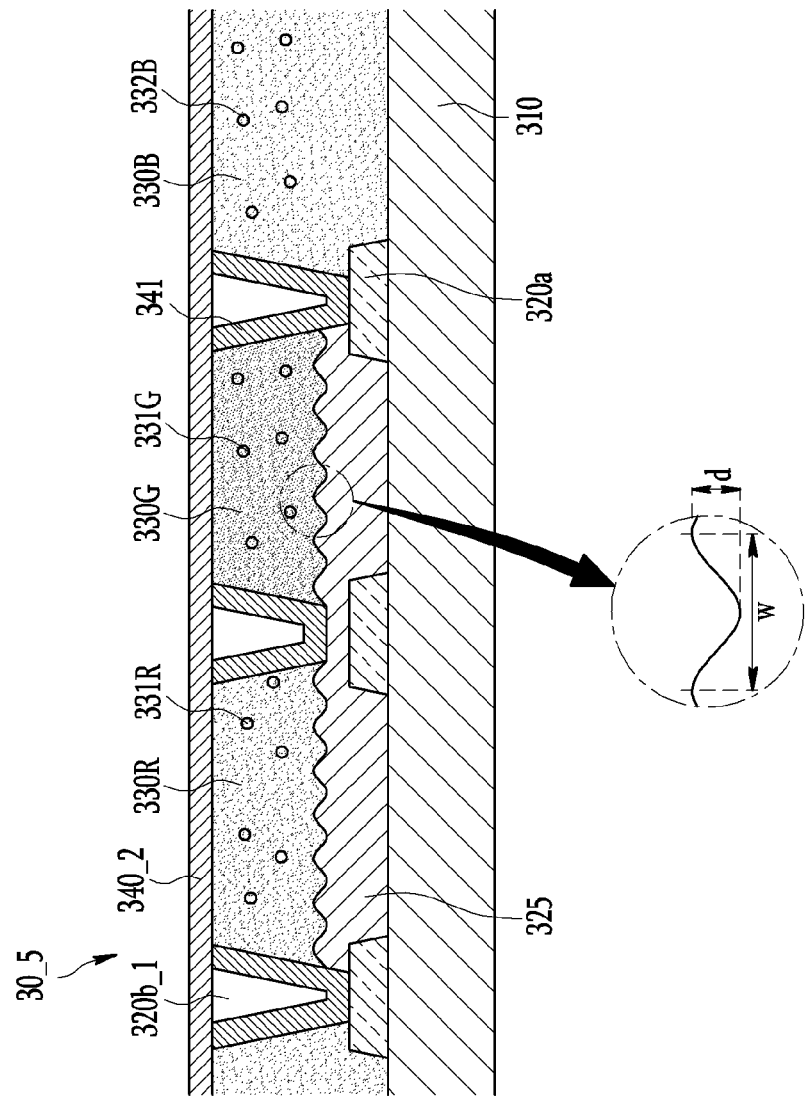

FIGS. 2, 3, and 4 are cross-sectional views illustrating color conversion panels according to various exemplary embodiments. The color conversion panels of FIGS. 2 to 4 are similar to the color conversion panel 30 of FIG. 1. As such, primarily differences will be described to avoid obscuring exemplary embodiments.

Referring to FIG. 2, the color conversion panel 30_3 may include a buffer layer 321 disposed on the substrate 310 and the light blocking member 320. The buffer layer 321 may be made of an inorganic material, e.g., silicon nitride (SiNx). The buffer layer 321 can facilitate formation of the red color conversion layer 330R, the green color conversion layer 330G, and the transmission layer 330B described later and/or can protect the substrate 310.

The blue light cutting filter 325 may be disposed on the buffer layer 321. The blue light cutting filter 325 is disposed in regions for emitting red and green light, but is not disposed in a region for emitting blue light. The blue light cutting filter 325 may have an opening that overlaps a region for emitting blue light. The blue light cutting filter 325 transmits light having a wavelength (or range of wavelengths) other than in a blue wavelength band, and blocks light having a wavelength (or range of wavelengths) in the blue wavelength band. The blue light cutting filter 325 may include any material for performing the aforementioned effect, and may be, for example, a yellow color filter.

One surface of the blue light cutting filter 325 may have irregularities. For instance, the blue light cutting filter 325 may have a first surface that faces the substrate 310, and a second surface that faces the first surface, contacts the red color conversion layer 330R and the green color conversion layer 330G, and has irregularities. Roughness of the second surface of the blue light cutting filter 325 may be increased.

Light emitted from the color conversion panel 30_3 is emitted in a direction from the red color conversion layer 330R and the green color conversion layer 330G toward the substrate 310. Light from the red color conversion layer 330R and the green color conversion layer 330G toward the blue light cutting filter 325 can be emitted toward the substrate 310 in one side surface including the irregularities.

A blue color filter 325B is disposed on the buffer layer 321. The blue color filter 325B may be disposed in a region that emits blue light to overlap the transmission layer 330B_1 which will be described in more detail later. According to some exemplary embodiments including the blue color filter 325B, the transmission layer 330B_1 may not include a dye or a pigment.

One surface of the blue color filter 325B may have irregularities. For instance, the blue color filter 325B may have a first surface that faces the substrate 310, and a second surface that faces the first surface, contacts the red color conversion layer 330R and the green color conversion layer 330G, and has irregularities. Roughness of the second surface of the blue color filter 325B may be increased.

The irregularities of the blue color filter 325B may have an irregular shape. As shown in FIG. 2, the irregularities include a recess portion and a convex portion. In this case, a ratio of a distance w1 between adjacent convex portions (or a distance between adjacent concave portions) and a depth d1 between an inflection point of the convex portion and an apex of the concave portion which are adjacent to each other may be about 1:1 to about 10:1. The depth d1 may be in a range of about 0.1 μm to about 2 μm, and the distance w1 may be in a range of about 0.01 μm to 2 μm. Within this numerical range, effective light emission is possible. It is also noted that the ration between distance w1 and depth d1 may be the same as or different from the ratio between distance w and depth d in association with the irregularities of the blue light cutting filter 325.

The red color conversion layer 330R and the green color conversion layer 330G are disposed on the blue light cutting filter 325. The transmission layer 330B_1 may be disposed on the blue color filter 325B. In this manner, the transmission layer 330B_1 may fill less space between capping layer 340 and substrate 310 than the transmission layer 330B.

The red color conversion layer 330R may include at least one of a phosphor and a quantum dot 331R for converting introduced blue light into red light. The green color conversion layer 330G may have at least one of a phosphor and a quantum dot 331G for converting introduced blue light into green light. The transmission layer 330B may emit introduced light without any color conversion and may emit blue light, for example.

The capping layer 340 may have a structure in which an inorganic layer having a relatively high refractive index and an inorganic layer having a relatively low refractive index are alternately stacked to form about 10 to 20 layers.

Referring to FIG. 3, a color conversion panel 30_4 may include a first light blocking member 320a disposed on the substrate 310. The first light blocking member 320a may be disposed between the red color conversion layer 330R and the green color conversion layer 330G, between the green color conversion layer 330G and the transmission layer 330B, and between the transmission layer 330B and the red color conversion layer 330R or the same layers of the red color conversion layer 330R, the green color conversion layer 330G, and/or the transmission layer 330B. The first light blocking member 320a may define regions where the red color conversion layer 330R, the green color conversion layer 330G, and the transmission layer 330B are disposed, and, thereby, exposed for light transmission.

A blue light cutting filter 325 may be disposed on at least portions of the substrate 310 and the first light blocking member 320a. The red color conversion layer 330R and the green color conversion layer 330G are disposed on the blue light cutting filter 325, and the transmission layer 330B is disposed on the substrate 310.

The red color conversion layer 330R may have at least one of a phosphor and a quantum dot 331R for converting introduced blue light into red light. The green color conversion layer 330G may have at least one of a phosphor and a quantum dot 331G for converting introduced blue light into green light. The transmission layer 330B may emit introduced light without any color conversion and may emit blue light, for example.

A second light blocking member 320b may be disposed between side surfaces of the red color conversion layer 330R and the green color conversion layer 330G, between side surfaces of the green color conversion layer 330G and the transmission layer 330B, and between side surfaces of the transmission layer 330B and the red color conversion layer 330R, or the same layers of the red color conversion layer 330R, the green color conversion layer 330G, and/or the transmission layer 330B. The second light blocking member 320b may be substantially flush with the red color conversion layer 330R, the green color conversion layer 330G, and the transmission layer 330B. Accordingly, upper surfaces of the second light blocking member 320b, the red color conversion layer 330R, the green color conversion layer 330G, and the transmission layer 330B may be substantially flat. The second light blocking member 320b can prevent color mixing of light emitted from the red color conversion layer 330R, the green color conversion layer 330G, and the transmission layer 330B.

Although the color conversion panel 30_4 has been described including the first light blocking member 320a and the second light blocking member 320b, exemplary embodiments are not limited thereto or thereby. For example, one of the first light blocking member 320a and the second light blocking member 320b may be omitted.

A capping layer 340_2 is disposed on the red color conversion layer 330R, the green color conversion layer 330G, the transmission layer 330B, and the second light blocking member 320b. The capping layer 340_2 may have a structure in which an inorganic layer having a relatively high refractive index and an inorganic layer having a relatively low refractive index are alternately stacked to form about 10 to 20 layers. That is, the capping layer 340_2 may have a structure in which a plurality of layers having different refractive indices are stacked.

Referring to FIG. 4, a color conversion panel 30_5 may include a first light blocking member 320a disposed on the substrate 310. The first light blocking member 320a may be disposed between the red color conversion layer 330R and the green color conversion layer 330G, between the green color conversion layer 330G and the transmission layer 330B, and between the transmission layer 330B and the red color conversion layer 330R, or the same layers of the red color conversion layer 330R, the green color conversion layer 330G, and/or the transmission layer 330B. The first light blocking member 320a may define regions where the red color conversion layer 330R, the green color conversion layer 330G, and the transmission layer 330B are disposed, and, thereby, exposed for light transmission.

A blue light cutting filter 325 may be disposed on at least portions of the substrate 310 and the first light blocking member 320a. The blue light cutting filter 325 is disposed only in regions that emit red and green light, but is not disposed in a region that emits blue light. The red color conversion layer 330R and the green color conversion layer 330G are disposed on the blue light cutting filter 325, and the transmission layer 330B is disposed on the substrate 310.

The red color conversion layer 330R may have at least one of a phosphor and a quantum dot 331R for converting introduced blue light into red light. The green color conversion layer 330G may have at least one of a phosphor and a quantum dot 331G for converting introduced blue light into green light. The transmission layer 330B may emit introduced light without any color conversion and may emit blue light, for example.

A reflection member 341 may be disposed between the red color conversion layer 330R and the green color conversion layer 330G, between the green color conversion layer 330G and the transmission layer 330B, and between the transmission layer 330B and the red color conversion layer 330R, or the same layers of the red color conversion layer 330R, the green color conversion layer 330G, and/or the transmission layer 330B. A first portion of the reflection member 341 disposed between side surfaces of the transmission layer 330B and the red color conversion layer 330R and between side surfaces of the green color conversion layer 330G and the transmission layer 330B is positioned on the first light blocking member 320a. A second portion of the reflection member 341 disposed between the red color conversion layer 330R and the green color conversion layer 330G is positioned on the blue light cutting filter 325.

The reflection member 341 may be formed of a metal material. The reflection member 341 reflects light emitted from the red color conversion layer 330R, the green color conversion layer 330G, and the transmission layer 330B toward the side surfaces thereof instead of a direction toward the substrate 310 or the capping layer 340. The reflected light may be emitted toward the substrate 310 through the red color conversion layer 330R, the green color conversion layer 330G, and the transmission layer 330B. A light emission efficiency of the color conversion panel 30_5 may be increased through the reflection member 341.

A second light blocking member 320b_1 is disposed on the reflection member 341. The second light blocking member 320b_1 may be disposed between the red color conversion layer 330R and the green color conversion layer 330G, between the green color conversion layer 330G and the transmission layer 330B, and between the transmission layer 330B and the red color conversion layer 330R, or the same layers of the red color conversion layer 330R, the green color conversion layer 330G, and/or the transmission layer 330B. The reflection member 341 may be disposed between the second light blocking member 320b_1 and the substrate 310, and, as such, the second light blocking member 320b_1 may occupy less space (e.g., may be smaller) between the capping layer 340_2 and the substrate 310 than the second light blocking member 320b of FIG. 3.

The second light blocking member 320b_1 may be substantially flush with the red color conversion layer 330R, the green color conversion layer 330G, and the transmission layer 330B. Upper surfaces of the second light blocking member 320b_1, the red color conversion layer 330R, the green color conversion layer 330G, and the transmission layer 330B may be substantially flat. The second light blocking member 320b_1 can prevent color mixing of light emitted from the red color conversion layer 330R, the green color conversion layer 330G, and the transmission layer 330B.

Although the color conversion panel 30_5 has been described as including the first light blocking member 320a and the second light blocking member 320b_1, exemplary embodiments are not limited thereto or thereby. For example, one of the first light blocking member 320a and the second light blocking member 320b_1 may be omitted.

A capping layer 340_2 is disposed on the red color conversion layer 330R, the green color conversion layer 330G, the transmission layer 330B, and the second light blocking member 320b_1.

A method of manufacturing a color conversion panel according to some exemplary embodiments will be described with reference to FIGS. 5 to 9. FIGS. 5 to 9 are cross-sectional views of a color conversion panel at various stages of manufacture according to some exemplary embodiments. For descriptive and illustrative convenience, the method of manufacturing a color conversion panel will be described in association with the color conversion panel 30 of FIG. 1.

Figure 5:
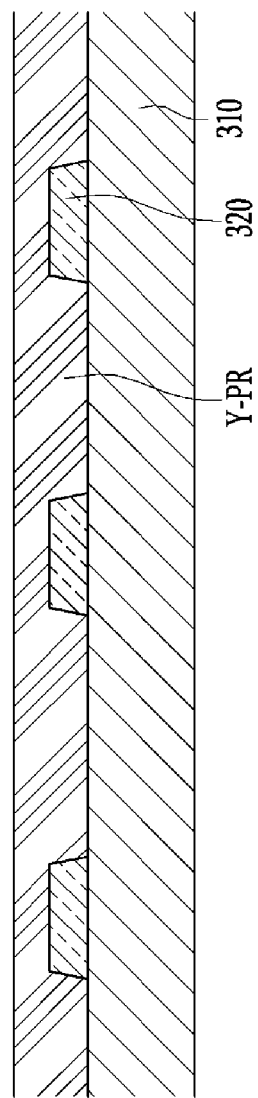
FIGS. 5, 6, 7, 8, and 9 are cross-sectional views of a color conversion panel at various stages of manufacture according to some exemplary embodiments.

Referring to FIG. 5, a light blocking material may be coated and patterned on the substrate 310 to form the light blocking member 320. The light blocking member 320 may be formed to define regions where the red color conversion layer 330R, the green color conversion layer 330G, and the transmission layer 330B are to be formed. Next, a photosensitive resin material is coated on the substrate 310 to form a photosensitive resin layer Y-PR. Herein, the photosensitive resin layer Y-PR may be formed on an entire surface of the substrate 310 and covering an entire surface of the light shielding member 320; however, exemplary embodiments are not limited thereto or thereby.

Figure 6:
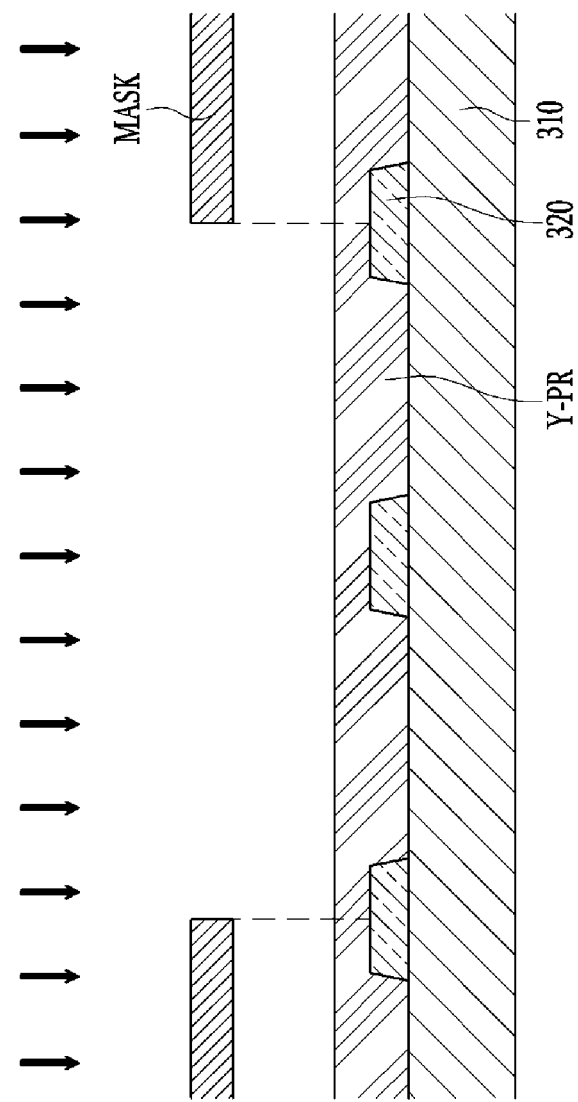

As shown in FIG. 6, a mask MASK is positioned on (or over) the substrate 310 to perform an exposure process. In this case, the mask MASK has a shape that exposes regions in which the red color conversion layer 330R and the green color conversion layer 330G will be formed, but it is not limited thereto.

Figure 7:
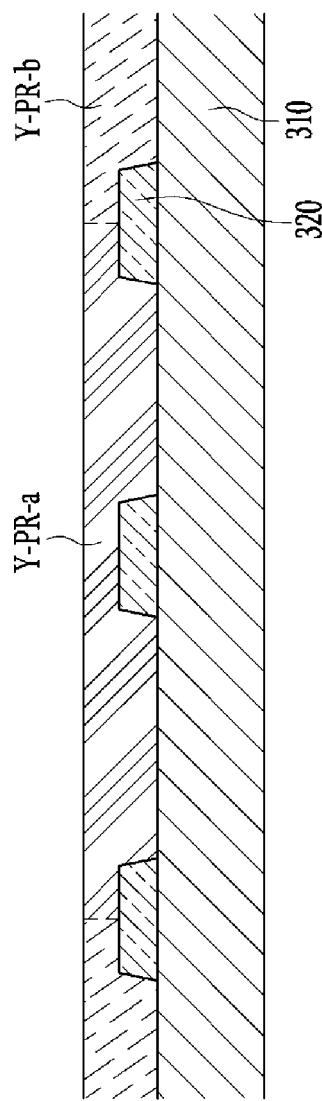

With reference to FIG. 7, the mask MASK is removed. The photosensitive resin layer may have a region Y-PR-a that is cured through the above-noted exposure process and a region Y-PR-b that is not cured. A surface treatment process may be performed on an entire surface of the photosensitive resin layer including the regions Y-PR-a and Y-PR-b. The surface treatment process may be a dry etching process (e.g., anisotropic ion etching), but exemplary embodiments are not limited thereto or thereby. For example, any suitable process to perform a surface treatment to be described in more detail below may be utilized.

Figure 8:
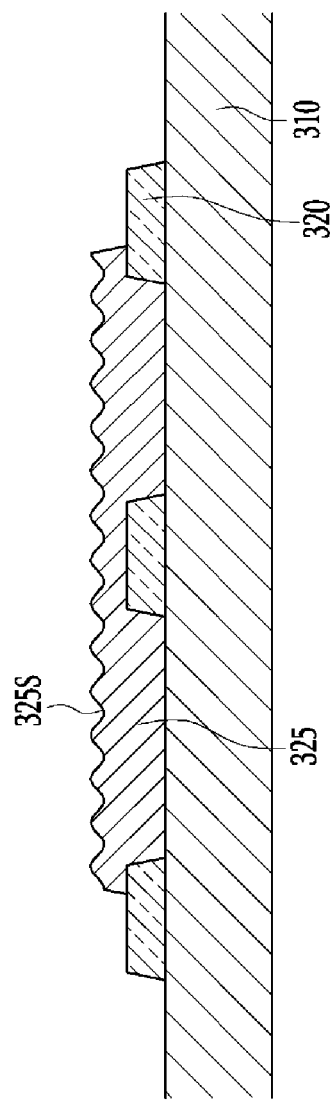

A surface of the photosensitive resin layer is etched depending on the above-described surface treatment process to form a surface 325S, as shown in FIG. 8. In this manner, a blue light cutting filter 325 including the surface 325S having irregularities at a portion corresponding to the cured region is formed. In this case, the surface 325S of the blue light cutting filter 325 may have a hydrophilic property depending on the surface treatment process utilized to form surface 325S.

The blue light cutting filter 325 may be formed by performing a development process (e.g., a wet etching process) on photosensitive resin compositions (Y-PR-a and Y-PR-b). For example, a photosensitive resin layer disposed in an unexposed area that overlaps the mask MASK described above may be removed to form the blue light cutting filter 325 including the surface 325S.

Figure 9:
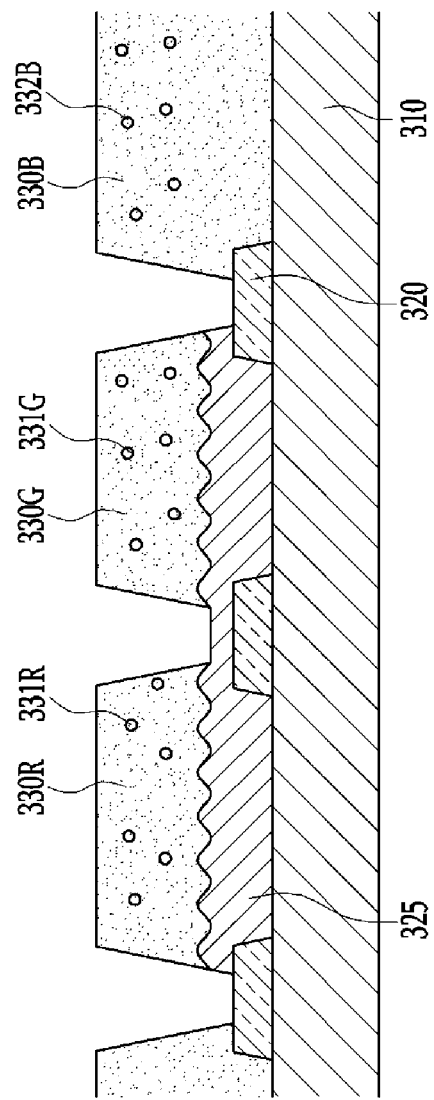

Referring to FIG. 9, the red color conversion layer 330R including the phosphor or red quantum dot 331R is formed on the blue light cutting filter 325, and the green color conversion layer 330G including the phosphor or green quantum dot 331G is formed on the blue light cutting filter 325. The transmission layer 330B including a dye or pigment 332B is formed on the substrate 310.

The color conversion panel 30 illustrated in FIG. 1 is formed via formation of a capping layer 340, which is formed by stacking, for instance, an organic material, inorganic material, and/or the like, on the light blocking member 320, the red color conversion layer 330R, the green color conversion layer 330G, and the transmission layer 330B.

Although an exemplary embodiment in which the photosensitive resin layer Y-PR is exposed to light and the entire surface of the exposed photosensitive resin layer Y-PR and the substrate 310 is subjected to a surface treatment has been described, exemplary embodiments are not limited thereto or thereby. For example, a process in which the surface treatment is performed only on a photosensitive resin pattern that remains after exposure and development is performed on the photosensitive resin layer Y-PR is also contemplated. In this manner, the surface treatment may be performed in a state in which a mask (e.g., mask MASK) is not removed. This enables the surface treatment to be perform on an upper surface of the photosensitive resin layer Y-PR without damage to the substrate 310. The surface treatment may utilize a dry etching step, and as such, a cross-section of the blue light cutting filter 325 may have a tapered shape. Corners of the blue light cutting filter 325 may be partially etched through the dry etching step to have a regular tapered shape.

Figure 10:
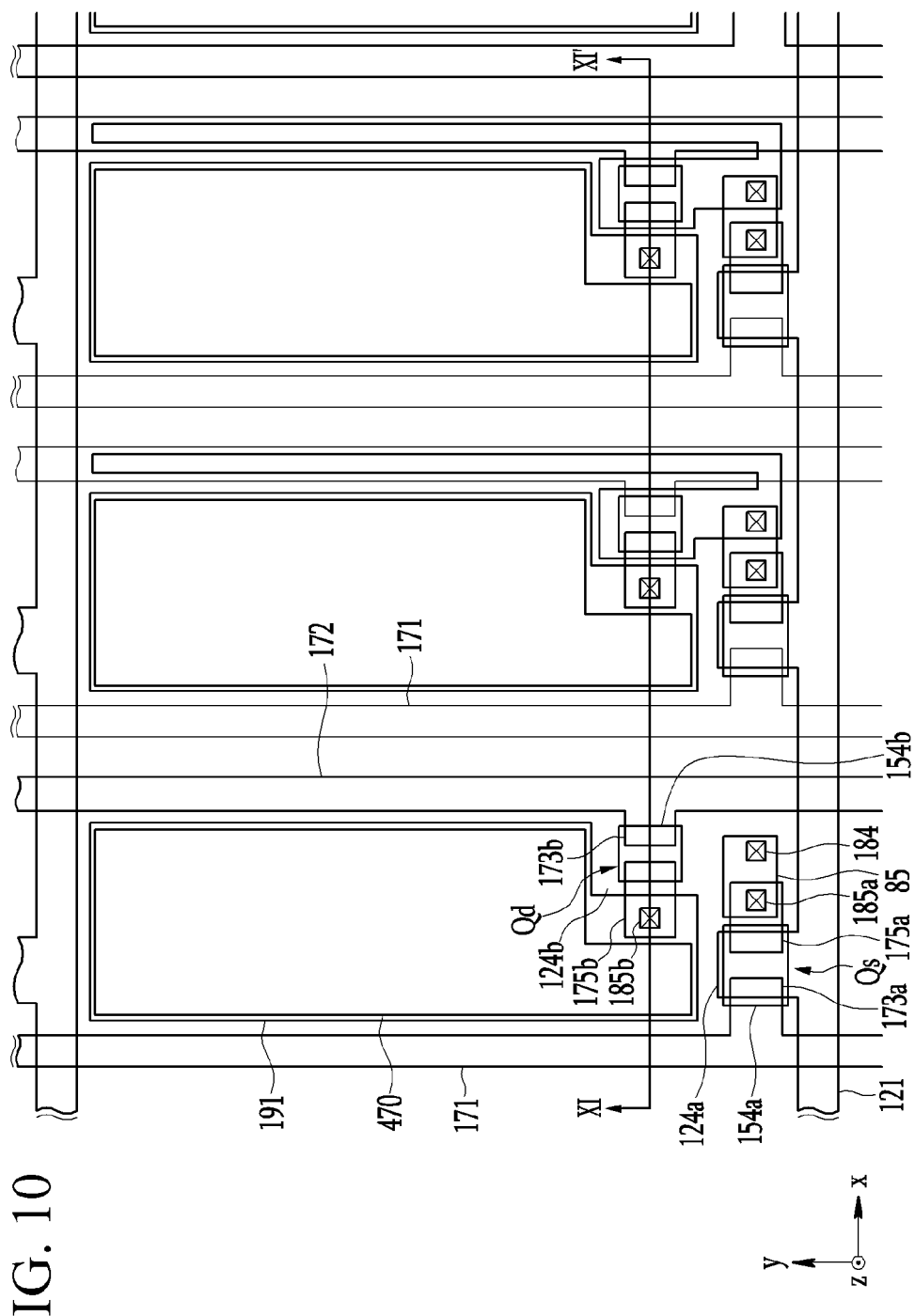
FIG. 10 is a plan view illustrating a display device according to some exemplary embodiments.
Figure 11:
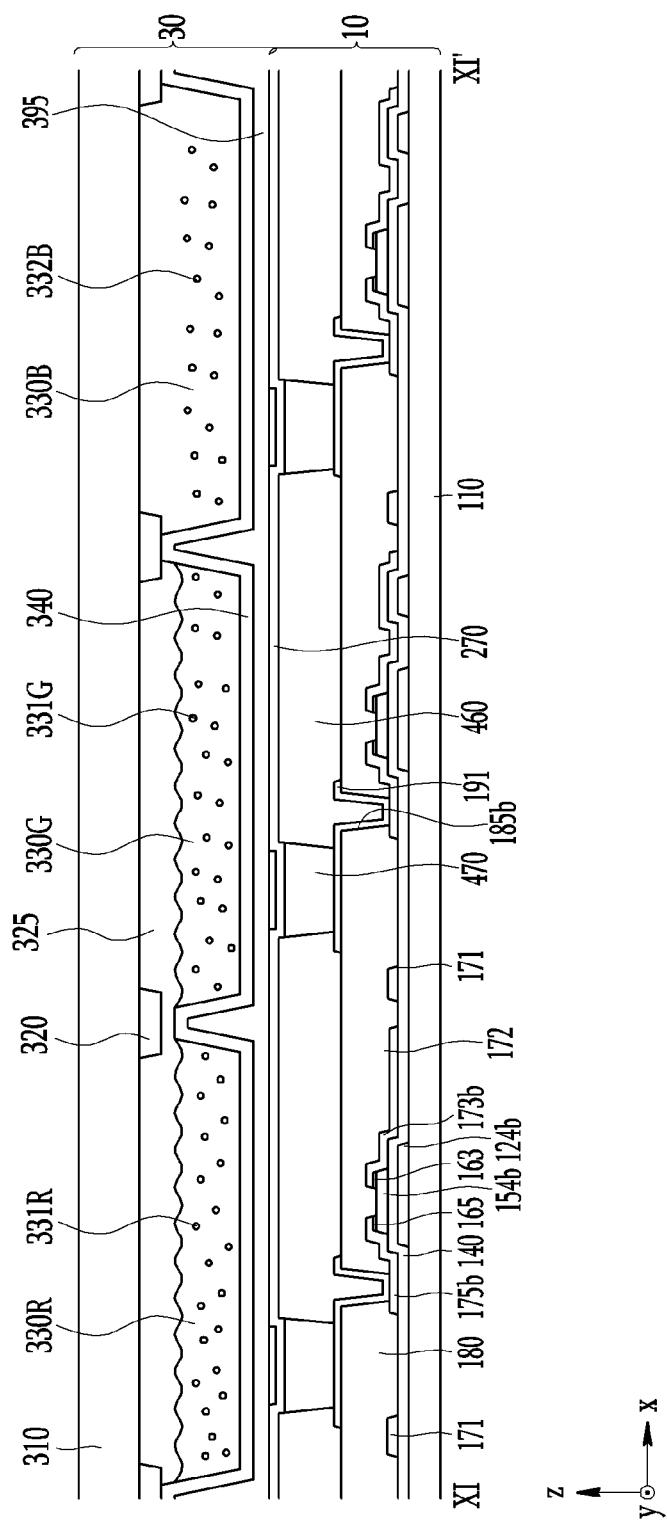
FIG. 11 is a cross-sectional view of the display device of FIG. 10 taken along sectional line XI-XI' according to some exemplary embodiments.

A display device according to some exemplary embodiments will be described with reference to FIGS. 10 and 11. FIG. 10 is a plan view illustrating a display device according to some exemplary embodiments. FIG. 11 is a cross-sectional view of the display device of FIG. 10 taken along sectional line XI-XI' according to some exemplary embodiments. For illustrative and descriptive convenience, FIGS. 10 and 11 are described with reference to the color conversion panel 30 of FIG. 1A, but exemplary embodiments are not limited thereto or thereby.

The display device illustrated in FIGS. 10 and 11 includes a display panel 10 and a color conversion panel 30 disposed on the display panel 10. Since the color conversion panel 30 illustrated in FIGS. 10 and 11 is the same as the color conversion panel 30 described in association with FIG. 1A, a detailed description thereof will be omitted. In addition, the color conversion panel 30 may be replaced with or augmented by at least one of the color conversion panels in any one of FIGS. 1B, 1C, and 2 to 4.

The display panel 10 includes gate conductors including a gate line 121 a first gate electrode 124a, and a second gate electrode 124b, on a first substrate 110. A gate insulating layer 140 made of a silicon nitride (SiNx), a silicon oxide (SiO$_y$), or the like is disposed on the gate conductors 121, 124a, and 124b.

A first semiconductor layer 154a and a second semiconductor layer 154b including, for instance, hydrogenated amorphous silicon (abbreviated as a-Si for amorphous silicon) or polycrystalline silicon are disposed on the gate insulating layer 140. The first semiconductor layer 154a and the second semiconductor layer 154b are respectively disposed on the first gate electrode 124a and the second gate electrode 124b. Ohmic contacts 163 and 165 are disposed on the first semiconductor layer 154a and the second semiconductor layer 154b. The ohmic contacts may be omitted depending on an exemplary embodiment.

Data conductors including a data line 171, a driving voltage line 172, a first drain electrode 175a, and a second drain electrode 175b are disposed on the ohmic contacts 163 and 165 and the gate insulating layer 140. The data line 171 includes a first source electrode 173a that extends toward the first gate electrode 124a. The driving voltage line 172 includes a second source electrode 173b that extends toward the second gate electrode 124b.

The first drain electrode 175a and the second drain electrode 175b are separated from each other and are separated from the data line 171 and the driving voltage line 172. The first source electrode 173a and the first drain electrode 175a face each other based on the first gate electrode 124a, and the second source electrode 173b and the second drain electrode 175b face each other based on the second gate electrode 124b.

A passivation layer 180 is disposed on the data conductors 171, 172, 173a, 173b, 175a, and 175b and the exposed semiconductor layers 154a and 154b. Contact holes 185a and 185b for respectively exposing the first drain electrode 175a and the second drain electrode 175b are formed in the passivation layer 180, and a contact hole 184 for exposing the second gate electrode 124b is formed in the passivation layer 180 and the gate insulating layer 140.

A pixel electrode 191 and a connecting member 85 are disposed on the passivation layer 180. The pixel electrode 191 is physically and electrically connected to the second drain electrode 175b through the contact hole 185b, and the connecting member 85 is connected with the second gate electrode 124b and the first drain electrode 175a through the contact holes 184 and 185a.

A partition wall 460 is disposed on the passivation layer 180. The partition wall 460 surrounds a periphery of the pixel electrode 191 like a bank to define an opening, and is made of an organic insulator or an inorganic insulator. The partition wall 460 may be made of a photoresist including a black pigment. In this case, the partition wall 460 may serve as a light blocking member.

An emission layer 470 is disposed on the pixel electrode 191. According to the present exemplary embodiment, the emission layer 470 of the emissive display device is made of a material which emits blue light. In a case of a general emissive display device, materials uniquely emitting any one light among primary colors, such as three primary colors of red, green, and blue are all included. However, in the case of an emissive display device according to one or more exemplary embodiments, the color conversion panel 30 for representing each color of red, green, and blue is positioned at the upper surface of the emissive display device such that only the material emitting blue light may be included. A common electrode 270 is disposed on the emission layer 470.

In the emissive display device, the first gate electrode 124a connected to the gate line 121, the first source electrode 173a connected to the data line 171, and the first drain electrode 175a form a switching thin film transistor (TFT) Qs along with the first semiconductor layer 154a, and the channel of the switching thin film transistor Qs is formed in the first semiconductor layer 154a between the first source electrode 173a and the first drain electrode 175a. The second gate electrode 124b connected to the first drain electrode 175a, the second source electrode 173b connected to the driving voltage line 172, and the second drain electrode 175b connected to the pixel electrode 191 form a driving thin film transistor (TFT) Qd along with the second semiconductor layer 154b, and the channel of the driving thin film transistor Qd is formed in the second semiconductor layer 154b between the second source electrode 173b and the second drain electrode 175b. The pixel electrode 191, the emission layer 470, and the common electrode 270 form a light emitting diode (LED), and in this case, the pixel electrode 191 is an anode and the common electrode 270 is a cathode, or in contrast, the pixel electrode 191 may be the cathode and the common electrode 270 may be the anode.

This emissive display device may emit light upward and downward with respect to the first substrate 110 to display an image, and in one or more exemplary embodiments, light is emitted upward with respect to the first substrate 110.

In the color conversion panel 30, the substrate 310 of the color conversion panel 30 may face the first substrate 110, and the red color conversion layer 330R, the green color conversion layer 330G, the transmission layer 330B, the light blocking member 320, and the like, may be stacked between the substrate 310 and the display panel 10. In addition, a planarization layer 395 may be further disposed between the capping layer 340 and the display panel 10 according to some exemplary embodiments.

According to some exemplary embodiments, the light emitting display device of FIGS. 10 and 11 can provide excellent display quality by improving a luminous efficiency and color reproducibility via inclusion of the color conversion panel 30.

Figure 12:
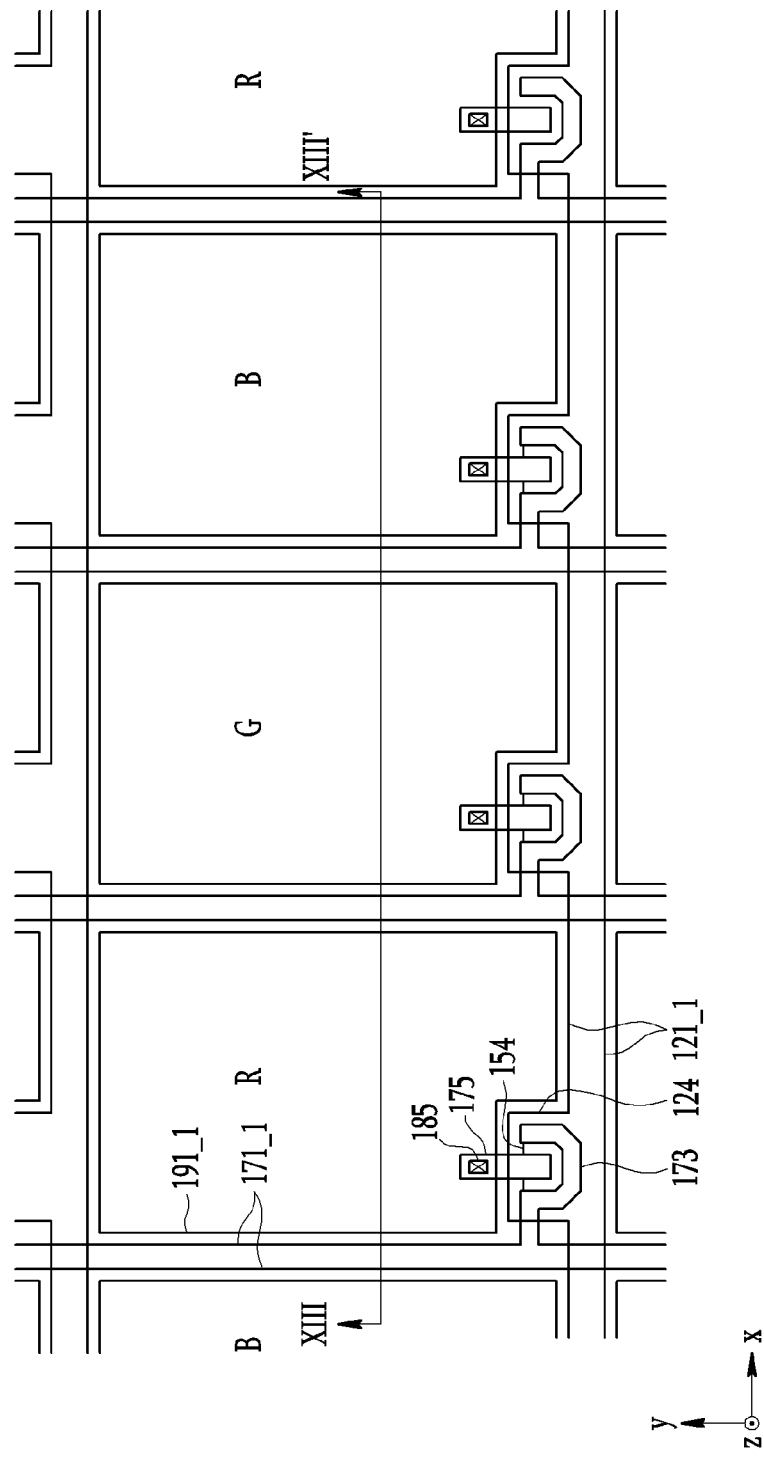
FIG. 12 is a plan view illustrating a display device according to some exemplary embodiments.
Figure 13:
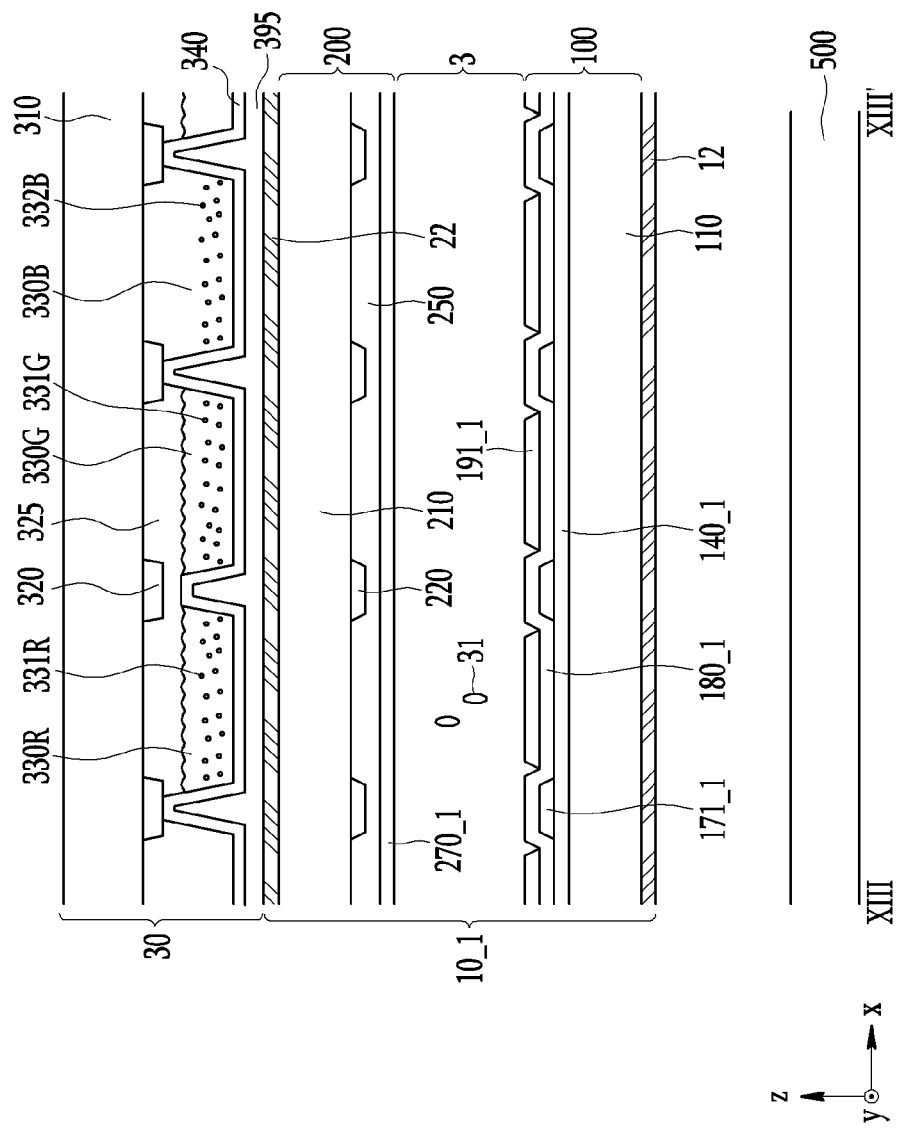
FIG. 13 is a cross-sectional view of the display device of FIG. 12 taken along sectional line XIII-XIII' according to some exemplary embodiments.

A display device according to some exemplary embodiments will be described with reference to FIGS. 12 and 13. FIG. 12 is a plan view illustrating a display device according to some exemplary embodiments. FIG. 13 is a cross-sectional view of the display device of FIG. 12 taken along sectional line XIII-XIII' according to some exemplary embodiments. For illustrative and descriptive convenience, FIGS. 12 and 13 are described with reference to the color conversion panel 30 of FIG. 1A, but exemplary embodiments are not limited thereto or thereby. As such, the color conversion panel 30 may be replaced with or augmented by at least one of the color conversion panels in any one of FIGS. 1B, 1C, and 2 to 4.

Referring to FIGS. 12 and 13, a display device includes a light unit 500, a display panel 10_1 disposed on the light unit 500, and a color conversion panel 30 disposed on the display panel 10_1. For example, the display panel 10_1 may be disposed between the color conversion panel 30 and the light unit 500.

The light unit 500 may include a light source (not illustrated) positioned below the display panel 10_1 and emits light, and a light guide (not shown) that receives the light and guides the received light in a direction of the display panel 10_1 and the color conversion panel 30. When the display panel 10_1 is a self-emissive display device, the light unit 500 may be omitted. For instance, the display panel 10 of FIGS. 10 and 11 does not include a light unit 500.

The light unit 500 may include at least one light emitting diode (LED), and for example, may be a blue LED. The light source, according to an exemplary embodiment, may be an edge type of light unit disposed on at least one lateral surface of the light guide, or a direct type of light unit in which the light source of the light unit 500 is disposed directly under the light guide (not shown), but exemplary embodiments are not limited thereto or thereby.

The display panel 10_1 includes a lower panel 100 including a thin film transistor, an upper panel 200 overlapping the lower panel 100, and a liquid crystal layer 3 interposed between the lower panel 100 and the upper panel 200. The display panel 10_1 may further include a first polarizer 12 positioned between the lower panel 100 and the light unit 500, and a second polarizer 22 positioned between the upper panel 200 and the color conversion panel 30. The first polarizer 12 and the second polarizer 22 polarize light emitted from the light unit 500.

One or more of a coated type of polarizer and a wire grid polarizer may be used as the first and second polarizers 12 and 22. The first and second polarizers 12 and 22 may be positioned at one surface of the lower and upper display panels 100 and 200 in various forms, such as a film form, a coated form, and an attached form. However, exemplary embodiments are not limited thereto or thereby.

The lower panel 100 includes a first substrate 110. A plurality of pixels are positioned in a matrix form on the first substrate 110.

A gate line 121_1 extends in a first (e.g., x-axis) direction and includes a gate electrode 124. A gate insulating layer 140_1 is positioned on the gate line 121. A semiconductor layer 154 is positioned on the gate insulating layer 140_1. A data line 171_1 and a drain electrode 175 are positioned on the semiconductor layer 154 and extend in a second (e.g., y-axis) direction. The data line 171_1 includes a source electrode 173. A passivation layer 180_1 is positioned on the data line 171_1 and the drain electrode 175, and a pixel electrode 191_1 is physically and electrically connected to the drain electrode 175 through a contact hole 185. Each of the gate line 121_1, the gate electrode 124, the gate insulating layer 140_1, the semiconductor layer 154_1, the data line 171_1, the drain electrode 175, the source electrode 173, the passivation layer 180_1, the pixel electrode 191_1, and the contact hole 185 are positioned on (or over) the first substrate 110.

The semiconductor layer 154 positioned on the gate electrode 124 forms a channel layer in a region exposed by the source electrode 173 and the drain electrode 175. The gate electrode 124, the semiconductor layer 154, the source electrode 173, and the drain electrode 175 form a thin film transistor.

A second substrate 210 of the upper panel 200 overlaps the first substrate 110 and is separated from the first substrate 110. A light blocking member 220 may be positioned between the second substrate 210 and the liquid crystal layer 3. A flat layer 250 that has a flat surface may be positioned between the light blocking member 220 and the liquid crystal layer 3. The common electrode 270_1 may positioned between the flat layer 250 and the liquid crystal layer 3. In an exemplary embodiment, the flat layer 250 may be omitted. The common electrode 270_1 receiving a common voltage generates an electric field along with the pixel electrode 191_1 to arrange a plurality of liquid crystal molecules 31 in the liquid crystal layer 3.

Although not illustrated, an alignment layer positioned between the pixel electrode 191_1 and the liquid crystal layer 3 and/or between the common electrode 270_1 and the liquid crystal layer 3 may be further included.

The liquid crystal layer 3 includes the plurality of liquid crystal molecules 31, and movement of the liquid crystal molecules 31 is controlled by the electric field formed between the pixel electrode 191_1 and the common electrode 270_1.

Although an exemplary structure in which the light unit 500, the lower panel 100, the liquid crystal layer 3, the upper panel 200, and the color conversion panel 30 are sequentially stacked on one another has been described and illustrated, exemplary embodiments are not limited thereto or thereby. For instance, the structure may include the light unit 500, the upper panel 200, the liquid crystal layer 3, the lower panel 100, and the color conversion panel 30 being sequentially stacked on one another.

The color conversion panel 30 illustrated in FIG. 13 is the same as the color conversion panel 30 of FIG. 1 described above, and may further include a planarization layer 395 disposed between the display panel 10_1 and the capping layer 340. The planarization layer 395 may be omitted depending on an exemplary embodiment.

Figure 14:
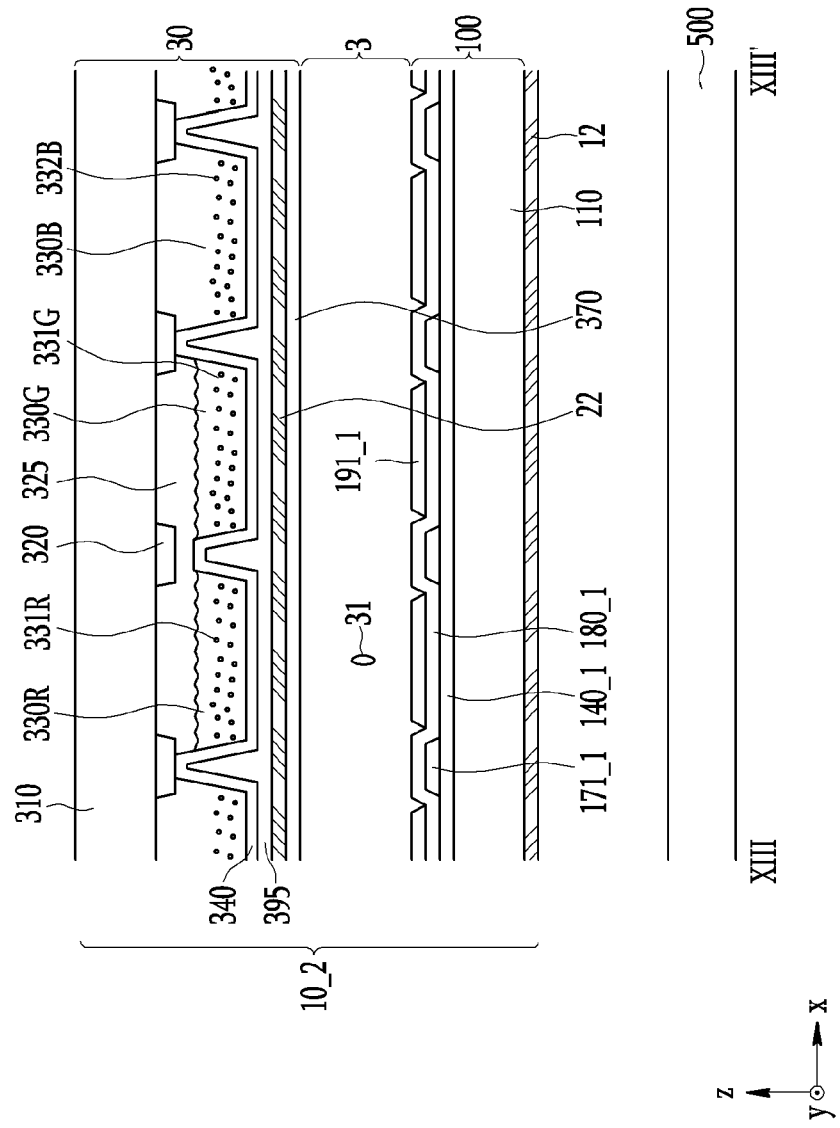
FIG. 14 is a cross-sectional view illustrating a display device according to some exemplary embodiments.

A display device according to some exemplary embodiments will be described with reference to FIGS. 12 and 14. As previously mentioned, FIG. 12 is a plan view illustrating a display device according to some exemplary embodiments. FIG. 14 is a cross-sectional view of the display device of FIG. 12 taken along sectional line XIII-XIII' according to some exemplary embodiments. For illustrative and descriptive convenience, FIGS. 12 and 14 are described with reference to the color conversion panel 30 of FIG. 1A, but exemplary embodiments are not limited thereto or thereby. As such, the color conversion panel 30 may be replaced with or augmented by at least one of the color conversion panels in any one of FIGS. 1B, 1C, and 2 to 4. Also, the display device of FIGS. 12 and 14 is similar to the display device of FIGS. 12 and 13, and, therefore, primarily differences will be described below.

The display device of FIGS. 12 and 14 includes a display panel 10_2 and a light unit 500. The display panel 10_2 may be disposed on the light unit 500, but exemplary embodiments are not limited thereto or thereby. For instance, in some exemplary embodiments, positions of the display panel 10_2 and the light unit 500 may be exchanged.

As seen in FIG. 14, the display panel 10_2 includes the lower panel 100, the color conversion panel 30 that faces the lower panel 100 while being spaced from the lower panel 100, and a liquid crystal layer 3 that is positioned between the lower panel 100 and the color conversion panel 30. The liquid crystal layer 3 includes a plurality of liquid crystal molecules 31. Unlike the display panel 10_1 described in association with FIG. 13, the color conversion panel 30 may be a portion of the display panel 10_2 of FIG. 14.

The lower panel 100 is the same as the lower panel 100 of FIG. 13, and the color conversion panel 30 is the same as the color conversion panel 30 of FIG. 1.

A gate line 121_1 extends in a first (e.g., x-axis) direction and includes a gate electrode 124. A gate insulating layer 140_1 is positioned on the gate line 121. A semiconductor layer 154 is positioned on the gate insulating layer 140_1. A data line 171_1 and a drain electrode 175 are positioned on the semiconductor layer 154 and extend in a second (e.g., y-axis) direction. The data line 171_1 includes a source electrode 173. A passivation layer 180_1 is positioned on the data line 171_1 and the drain electrode 175, and a pixel electrode 191_1 is physically and electrically connected to the drain electrode 175 through a contact hole 185. Each of the gate line 121_1, the gate electrode 124, the gate insulating layer 140_1, the semiconductor layer 154_1, the data line 171_1, the drain electrode 175, the source electrode 173, the passivation layer 180_1, the pixel electrode 191_1, and the contact hole 185 are positioned on (or over) the first substrate 110.

The semiconductor layer 154 positioned on the gate electrode 124 forms a channel layer in a region exposed by the source electrode 173 and the drain electrode 175. The gate electrode 124, the semiconductor layer 154, the source electrode 173, and the drain electrode 175 form a thin film transistor.

The color conversion panel 30 includes a substrate 310 that separately overlaps the first substrate 110. The color conversion panel 30 further includes a light blocking member 320 disposed between the substrate 310 and the lower panel 100.

A blue light cutting filter 325 may be disposed between the light blocking member 320 and the lower panel 100. A red color conversion layer 330R and a green color conversion layer 330G may be disposed between the blue light cutting filter 325 and the lower panel 100, and a transmission layer 330B may be disposed between the substrate 310 and the lower panel 100.

A capping layer 340 may be disposed between the red color conversion layer 330R, the green color conversion layer 330G, and the transmission layer 330B. The capping layer 340 may also be disposed between the substrate 310 and the lower panel 100. A planarization layer 395 may be disposed between the capping layer 340 and the lower panel 100. The planarization layer 395 may be omitted depending on an exemplary embodiment.

The display panel 10_2 may further include a first polarizer 12 positioned between the lower panel 100 and the light unit 500. A second polarizer 22 is disposed between the planarization layer 395 and the lower panel 100. A common electrode 370 may be disposed between the second polarizer 22 and the lower panel 100. A liquid crystal layer 3 including liquid crystal molecules 31 is disposed between the common electrode 370 and the lower panel 100.

Although not illustrated, the display device of FIGS. 12 and 14 may further include a first alignment layer disposed between the common electrode 370 and the liquid crystal layer 3, and a second alignment layer disposed between the lower panel 100 and the liquid crystal layer 3.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A color conversion panel comprising:
   a substrate;
   a color conversion layer disposed on the substrate, the color conversion layer comprising a quantum dot;
   a transmission layer disposed on the substrate; and
   a blue light cutting filter disposed between the substrate and the color conversion layer,
   wherein an interface between the color conversion layer and the blue light cutting filter comprises irregularities.

2. The color conversion panel of claim 1, further comprising:
   a blue color filter disposed between the transmission layer and the substrate.

3. The color conversion panel of claim 2, wherein an interface between the blue color filter and the transmission layer comprises irregularities.

4. The color conversion panel of claim 1, wherein:
   the color conversion layer comprises a red color conversion layer and a green color conversion layer; and
   the color conversion panel further comprises a light blocking pattern disposed between the red color conversion layer and the green color conversion layer, between the green color conversion layer and the transmission layer, and between the red color conversion layer and the transmission layer.

5. The color conversion panel of claim 4, wherein:
   the light blocking pattern is a first light blocking pattern; and
   the color conversion panel further comprises a second light blocking pattern overlapping side surfaces of at least two of the red color conversion layer, the green color conversion layer, and the transmission layer.

6. The color conversion panel of claim 4, further comprising:
   a reflection member configured to overlap a side surface of at least one of the red color conversion layer, the green color conversion layer, and the transmission layer.

7. The color conversion panel of claim 1, wherein:
   the irregularities have an irregular shape; and
   a ratio of a distance between adjacent convex portions and a depth between a convex portion and a concave portion which are adjacent to each other is about 1:1 to about 10:1.

8. The color conversion panel of claim 1, further comprising:
   at least one of a buffer layer disposed between the blue light cutting filter and the substrate and a capping layer disposed on the color conversion layer.

9. The color conversion panel of claim 1, wherein the irregularities are formed in a surface of the blue light cutting filter that opposes a surface of the substrate.

10. A method of manufacturing a color conversion panel, the method comprising:
    forming a photosensitive resin layer on a substrate;
    exposing the photosensitive resin layer;
    performing a surface treatment on the exposed photosensitive resin layer to form irregularities;
    patterning the exposed photosensitive resin layer to form a blue light cutting filter;
    forming a color conversion layer on the blue light cutting filter; and
    forming a transmission layer on the substrate.

11. The manufacturing method of claim 10, wherein:
    the photosensitive resin layer is exposed utilizing a mask; and
    the mask is removed before performing of the surface treatment.

12. The manufacturing method of claim 10, wherein:
    the photosensitive resin layer is exposed utilizing a mask; and
    the surface treatment is performed utilizing the mask to surface treat a region exposed by the mask.

13. The manufacturing method of claim 10, wherein a dry etching method is used in performing the surface treatment.

14. A display device comprising:
    a display panel; and
    a color conversion panel overlapping the display panel,
    wherein the color conversion panel comprises:
      a substrate;
      a color conversion layer disposed between the substrate and the display panel;
      a transmission layer disposed between the substrate and the display panel; and
      a blue light cutting filter disposed between the substrate and the color conversion layer, and
    wherein an interface between the color conversion layer and the blue light cutting filter comprises irregularities.

15. The display device of claim 14, further comprising:
    a blue color filter disposed between the transmission layer and the substrate.

16. The display device of claim 15, wherein an interface between the blue color filter and the transmission layer has irregularities.

17. The display device of claim 14, wherein:
    the color conversion layer includes a red color conversion layer and a green color conversion layer; and
    the color conversion panel further comprises a light blocking member disposed between the red color conversion layer and the green color conversion layer, between the green color conversion layer and the transmission layer, and between the red color conversion layer and the transmission layer.

18. The display device of claim 17, wherein:
    the light blocking member is a first light blocking member; and the color conversion panel further comprises a second light blocking member configured to overlap side surfaces of at least two of the red color conversion layer, the green color conversion layer, and the transmission layer.

19. The display device of claim 17, further comprising:
a reflection member configured to overlap a side surface of at least one of the red color conversion layer, the green color conversion layer, and the transmission layer.

20. The display device of claim 14, wherein:
the irregularities have an irregular shape; and
a ratio of a distance between adjacent convex portions and a depth between a convex portion and a concave portion which are adjacent to each other is about 1:1 to about 10:1.

\* \* \* \* \*